US011830779B2

(12) United States Patent
Berding et al.

(10) Patent No.: US 11,830,779 B2
(45) Date of Patent: *Nov. 28, 2023

(54) IN-SITU ETCH MATERIAL SELECTIVITY DETECTION SYSTEM

(71) Applicant: APPLIED MATERIALS, INC., Santa Clara, CA (US)

(72) Inventors: Keith Berding, San Jose, CA (US); Blake Erickson, Gilroy, CA (US); Soumendra Barman, San Jose, CA (US); Zhaozhao Zhu, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/398,822

(22) Filed: Aug. 10, 2021

(65) Prior Publication Data
US 2022/0051954 A1 Feb. 17, 2022

Related U.S. Application Data

(60) Provisional application No. 63/064,857, filed on Aug. 12, 2020.

(51) Int. Cl.
*H01L 21/66* (2006.01)
*H01L 21/3213* (2006.01)
*H01J 37/32* (2006.01)

(52) U.S. Cl.
CPC ........ *H01L 22/26* (2013.01); *H01J 37/32963* (2013.01); *H01L 21/32136* (2013.01); *H01L 21/32139* (2013.01); *H01J 2237/334* (2013.01)

(58) Field of Classification Search
None
See application file for complete search history.

(56) References Cited

U.S. PATENT DOCUMENTS 5,450,205 A 9/1995 Sawin et al.
5,694,207 A 12/1997 Hung et al.
(Continued)

FOREIGN PATENT DOCUMENTS

WO 2001018845 A1 3/2001

*Primary Examiner* — Stephanie P Duclair
(74) *Attorney, Agent, or Firm* — Lowenstein Sandler LLP

(57) ABSTRACT

An article, apparatus, and method for detecting an etch material selectivity is provided. A device including a first layer and a second layer is placed in a processing chamber. The first layer includes a first sense material deposited on a first portion of the device and a second sense material deposited on a second portion of the device. The second layer deposited on the first layer includes an etch material. During an etch process based on an initial set of etch parameter settings, a first amount of time to etch the second layer at the first portion of the device and a second amount of time to etch the second layer at the second portion of the device are measured. A first etch rate and a second etch rate of the processing chamber is determined based on the measured first amount of time, the measured second amount of time, and a thickness of the second layer. A first selectivity of the first etch material and a second selectivity of the second etch material is determined based on the first etch rate and the second etch rate. An optimized set of etch parameter settings for subsequent etch processes is determined based on the determined selectivities.

13 Claims, 9 Drawing Sheets

(56) References Cited

U.S. PATENT DOCUMENTS 6,270,622 B1  8/2001 Klippert, II et al.
2020/0006100 A1* 1/2020 Clark ............... H01L 21/67248

* cited by examiner

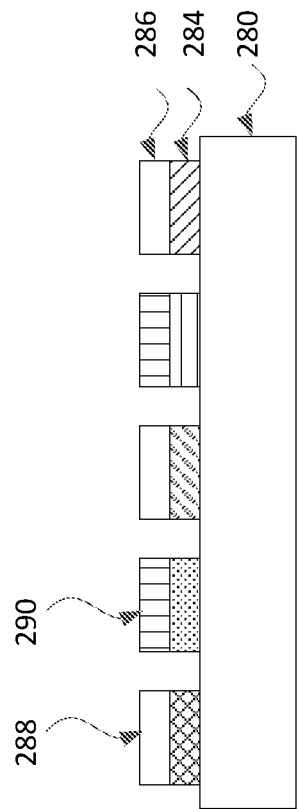
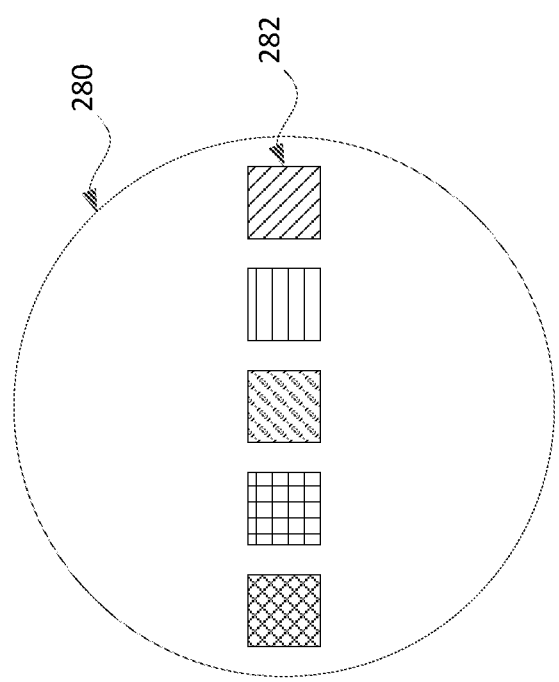

IN-SITU ETCH MATERIAL SELECTIVITY DETECTION SYSTEM

RELATED APPLICATIONS

This application claims the benefit under 35 U.S.C. § 119(e) of U.S. Provisional Patent Application No. 63/064,857, filed Aug. 12, 2020, which is incorporated herein, in its entirety, by this reference.

TECHNICAL FIELD

Embodiments of the present disclosure relate, in general, to in-situ etch material selectivity detection of a processing chamber.

BACKGROUND

Measuring a selectivity of etch materials in a processing chamber can be helpful in controlling the quality and consistency of devices processed at an electronics processing system. However, measuring and controlling an etch material selectivity of a processing chamber presents a common challenge in the electronics device manufacturing industry. In general, the selectivity of material etched at a processing chamber is determined based on an amount of the different materials etched from multiple devices during an etch process performed for a particular amount of time. Conventional etch material selectivity measurement techniques include several time consuming external measurements, such as external metrology measurements, for multiple devices (e.g., wafers, substrates, etc.) to determine the amount of material etched from each device during the etch process. For example, multiple devices each including a layer of a different material can be etched in a processing chamber. The thickness of the material on each device can be measured, using external metrology, before and after the etch process to determine the amount of the material etched from a particular device. can An etch rate for each material can be determined based on the amount of material etched from the device and the length of the etch process. Each etch rate can then be used to determine a selectivity of the processing chamber.

Identifying etch process parameter settings to control the selectivity of different etch materials at a processing chamber, also referred to as selectivity tuning, is a necessary step of process recipe development and overall system optimization. Experiments can be performed at a process chamber to identify a set of process parameter settings for a target etch material selectivity. During such experiments, system operators can perform multiple etch processes using different etch materials at different etch parameter settings and obtain measurements for each process. Each round of measurements for each etch process involves multiple external measurements of the etched material before and after the process. The amount of time to perform an external measurement before and after the etch process for each device can contribute to a significant amount of time and resources used during the experimentation to identify the target set of process parameter settings, limiting the amount of parameter setting optimization that can be obtained.

During operation of an electronic device manufacturing system, the selectivity of a process chamber can be monitored in order to detect any process defects. In order to monitor the selectivity of the process chamber during operation, an external measurement is obtained for multiple devices prior to an etch process, the etch process is performed, another external measurement is obtained for the devices after the etch process, and an etch material selectivity is determined based on these measurements. In response to determining the measured etch rate selectivity does not correspond to a target etch material selectivity, etch process parameter settings can be modified, and the etch material selectivity can be measured for a subsequent set of devices. These steps can be performed multiple times until the etch parameter settings for the process chamber allow for a target etch material selectivity. The performance of multiple external measurement steps to determine the etch parameter settings is time-consuming and contributes to the overall latency of the electronics processing system.

SUMMARY

Some of the embodiments described herein cover a method including causing a device to be placed in a processing chamber of an electronics processing system. The device includes a first layer deposited on a surface of the device, and a second layer deposited on the first layer. The first layer is composed of a first sense material deposited on a first portion of the surface of the device and a second sense material deposited on a second portion of the surface of the device. The second layer is composed of a first etch material deposited on the first sense material and a second etch material deposited on the second sense material. A first amount of time from an initiation of the etch process to a detection of a first indication of completion of etching of the first etch material is measured during an etch process at the processing chamber. A second amount of time from the initiation of the etch process to a detection of a second indication of completion of etching of the second etch material is also measured. The etch process etches the second layer of the device based on an initial set of etch parameter settings. A first etch rate is determined based on the measured first amount of time and a thickness of the second layer of the etched device. A second etch rate is determined based on the second amount of time and the thickness of the second layer of the etched device. A selectivity of the etch process performed at the processing chamber is determined based on the first etch rate and the second etch rate. An optimized set of etch parameter settings to be applied at the processing chamber during subsequent etch processes is determined based on the selectivity of the etch process.

In some embodiments, a device includes a first layer deposited on a surface of the device and a second layer deposited on the first layer. The first layer is composed of a first sense material deposited on a first portion of the surface of the device and a second sense material deposited on a second portion of the surface of the device. The second layer is composed of a first etch material deposited on the first sense material and a second etch material deposited on the second sense material. In response to the second layer being etched during an etch process performed at the processing chamber, at least one of the first sense material or the second sense material can be detected at the surface of the device.

In some embodiments, an electronics processing system includes a transfer chamber including a robot arm, a processing chamber connected to the transfer chamber, the processing chamber including an optical detection component to detect an indication of completion of an etch process performed within the processing chamber, and a controller operatively coupled to the robot arm and the optical detection component. The controller can cause the robot arm to place a device in the processing chamber. The device includes a first layer deposited on a surface of the device and a second layer deposited on the first layer. The first layer can be composed of a first sense material deposited on a first portion of the surface of the device and a second sense material deposited on a second portion of the surface of the device. The second layer can be composed of a first etch material deposited on the first sense material and a second sense material deposited on the second sense material. A first amount of time can be measured, during an etch process performed for the device, from an initiation of the etch process to a detection of a first indication of a completion of etching of the first etch material. A second amount of time can be measured from the initiation of the etch process to a detection of a second indication of completion of etching of the second etch material. The etch process can etch the second layer based on an initial set of etch parameter settings. A first etch rate of the processing chamber can be determined based on the measured first amount of time and a thickness of the second layer of the etched device. A second etch rate of the processing chamber can be determined based on the measured second amount of time and the thickness of the second layer of the etched device. A selectivity of the etch process performed at the processing chamber can be determined based on the first etch rate and the second etch rate. An optimized set of etch parameter settings to be applied during subsequent etch processes can be determined based on the selectivity of the etch process.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2G and FIG. 2H depict another example device for in-situ detection of an etch material selectivity of a processing chamber, according to aspects of the present disclosure.

DETAILED DESCRIPTION OF EMBODIMENTS

Figure 1:
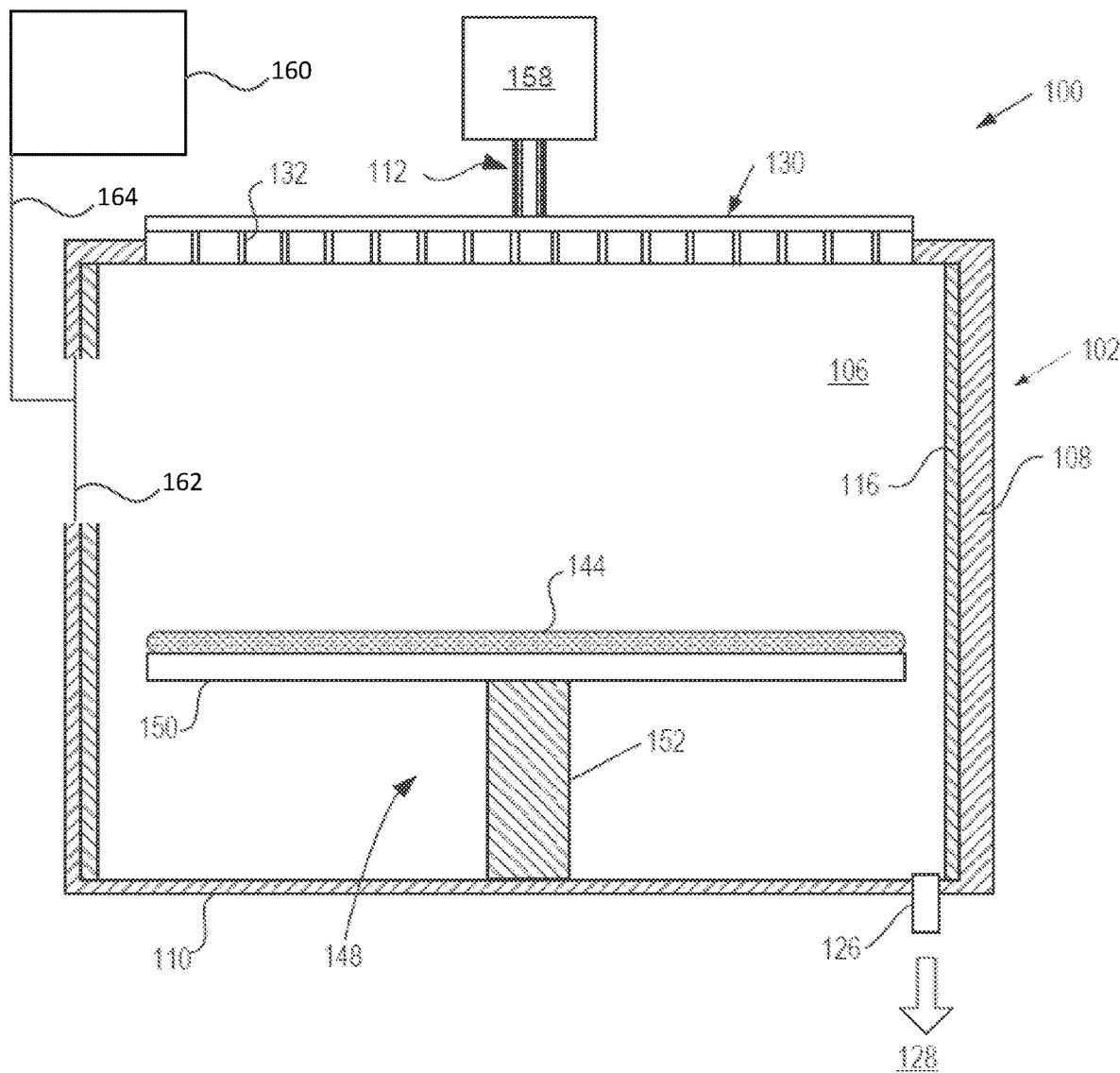
FIG. 1 is a top schematic view of an example processing chamber, according to aspects of the present disclosure.

Embodiments described herein are related to articles, systems, and methods for in-situ etch rate and etch material selectivity detection within a processing chamber of an electronics processing system. An etch rate can refer to a rate at which an etch material deposited on a surface of a device is etched at one or more portions of the surface of the device. In some embodiments, an etch rate can be determined based on an amount of etch material deposited on a surface of a device that is etched away over a period of time. An etch material selectivity refers to a ratio between two etch rates measured for two etch materials deposited on a surface of the device. In some embodiments, the etch material selectivity can be determined based on a first etch rate determined for a first portion of a surface of a device and a second etch rate determined for a second portion of the surface of the device. An etch rate uniformity can refer to a percentage of etch rate variation across the surface of the device. In some embodiments, an etch rate uniformity can be determined based on at least a first etch rate determined for a first portion of a surface of a device and a second etch rate can be determined for a second portion of the device. In some embodiments, an etch rate can be determined to be uniform across a surface of a device if a percentage of etch rate variation across the surface of a device satisfies a threshold percentage.

In some embodiments, a device including two or more sense materials and two or more etch materials can be used to determine an etch rate and/or an etch rate selectivity of a processing chamber. A first layer can be deposited on a surface of the device, where the first layer includes at least a first sense material and a second sense material. The first sense material can be deposited at a first portion of the surface of the device and the second sense material can be deposited at a second portion of the surface of the device. A sense material can include a dielectric material, such as a silicon-based material (e.g., silicon oxide ($SiO_2$), silicon nitride ($Si_3N_4$), poly silicon, etc.). In some embodiments, the sense material can include a metal material, such as a copper-based material or a tungsten-based material. An optical detection component can identify each sense material based on a detectable optical signature. The optical signature of a sense material can correspond to a wavelength of a set of photons emitted by a plasma of the sense material within the processing chamber. A second layer can be deposited on the first layer, where the second layer includes a first etch material and a second etch material. The first etch material and the second etch material can be etched from the surface of the device during the etch process.

The device can be placed in a processing chamber of an electronics processing system where an etch process can be performed based on an initial set of etch parameter settings to etch the second layer of device. During the etch process, an optical detection component of the processing chamber can detect one or more optical signatures of materials within the processing chamber. A first optical signature can correspond with the first sense material and a second optical signature can correspond with the second sense material. In some embodiments, the optical detection component can detect the first optical signature before detecting the second optical signature. A first amount of time from the beginning of the etch process to a detection of the first optical signature and a second amount of time from the beginning of the etch process to a detection of the optical signature can be measured. A first etch rate of the processing chamber is determined based on a thickness of the second layer and the measured first amount of time, and a second etch rate is determined based on the thickness of the second layer and the measured second amount of time. An etch material selectivity can be determined based on the first etch rate and the second etch rate. An optimized set of etch parameter settings can be determined based on the etch material selectivity of the processing chamber.

In some embodiments, an etch material selectivity for two or more processing chambers of an electronics processing system can be determined in accordance with previously described embodiments. Each etch material selectivity for each processing chamber can be compared to another etch material selectivity for another processing chamber to determine a difference between etch material selectivities of processing chambers of the electronics processing system. In response to determining a difference between the compared etch material selectivity exceeds a difference threshold, optimized parameters for one or more of the processing chambers of the electronics processing system can be determined in order to control etch material selectivity across each processing chamber of the electronics processing system.

By using techniques described in the present disclosure, an etch rate and/or etch rate selectivity can be determined for a processing chamber of an electronics processing system without performing multiple time-consuming external measurement steps. The device, including two or more etch materials and two or more sense materials, can be specially designed to detect an etch material selectivity at one or more specific portions of the surface of the device. Therefore, portions of the surface of the device that are not etched at the same etch rate as other portions of the surface can be more easily and quickly detected. In some implementations, the portions of the surface of the device that are not etched at the same etch rate can be detected by testing as few as one device including the one or more sense materials. As such, optimized parameter settings can be more easily determined to cause the portions of the surface of the device to be etched at the same rate as the other portions of the surface of the device at a processing chamber, increasing quality and consistency of each device processed at the processing chamber. Further, by more easily determining optimized parameter settings for each processing chamber of an electronics device processing system, quality and consistency of each device processed in the electronics processing system can be increased, increasing overall system yield.

FIG. 1 depicts a sectional view of a processing chamber 100, in accordance with embodiments of the present disclosure. The processing chamber 100 can be used for processes in which a corrosive plasma environment is provided. For example, the processing chamber 100 can be a chamber for a plasma etcher or plasma etch reactor, and so forth. In one embodiment, the processing chamber 100 includes a chamber body 102 and a showerhead 130 that encloses an interior volume 106. The showerhead 130 can include a showerhead base and a showerhead gas distribution plate. Alternatively, the showerhead 130 can be replaced by a lid and a nozzle in some embodiments, or by multiple pie shaped showerhead compartments and plasma generation units in other embodiments. The chamber body 102 can be fabricated from aluminum, stainless steel or other suitable material such as titanium (Ti). The chamber body 102 generally includes sidewalls 108 and a bottom 110.

An outer liner 116 can be disposed adjacent the sidewalls 108 to protect the chamber body 102. The outer liner 116 can be fabricated to include one or more apertures. In one embodiment, the outer liner 116 is fabricated from $Y_2O_3$, $Al_2O_3$, and so forth.

An exhaust port 126 can be defined in the chamber body 102, and can couple the interior volume 106 to a pump system 128. The pump system 128 can include one or more pumps and throttle valves utilized to evacuate and regulate the pressure of the interior volume 106 of the processing chamber 100.

The showerhead 130 can be supported on the sidewall 108 of the chamber body 102. The showerhead 130 (or lid) can be opened to allow access to the interior volume 106 of the processing chamber 100, and can provide a seal for the processing chamber 100 while closed. A gas panel 158 can be coupled to the processing chamber 100 to provide process and/or cleaning gases to the interior volume 106 through the showerhead 130 or lid and nozzle (e.g., through apertures of the showerhead or lid and nozzle). Showerhead 130 can be used for processing chambers used for dielectric etch (etching of dielectric materials). The showerhead 130 can include a gas distribution plate (GDP) and can have multiple gas delivery holes 132 (also referred to as channels) throughout the GDP. The showerhead 130 can be formed by metal or alloy plate with the protection by a multi-layer protective coating as described herein. The metal or alloy plate can be composed of aluminum, an aluminum alloy, or another metal or metal alloy. The showerhead 130 can be formed with the GDP bonded to an aluminum base or an anodized aluminum base. The GDP can be made from Si or SiC, or can be a ceramic such as $Y_2O_3$, $Al_2O_3$, $Y_3Al_5O_{12}$ (YAG), and so forth.

For processing chambers used for conductor etch (etching of conductive materials), a lid can be used rather than a showerhead. The lid can include a center nozzle that fits into a center hole of the lid. The lid can be a ceramic such as $Al_2O_3$, $Y_2O_3$, YAG, or a ceramic compound including $Y_4Al_2O_9$ and a solid-solution of $Y_2O_3$—$ZrO_2$. The nozzle can also be a ceramic, such as $Y_2O_3$, YAG, or the ceramic compound including $Y_4Al_2O_9$ and a solid-solution of $Y_2O_3$—$ZrO_2$.

Examples of processing gases that can be used to process devices in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. A remote plasma can be formed from any of these and/or other processing gases and then delivered through the plasma delivery line 112 to chamber 100. Accordingly, the remote plasma can be composed of $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A device support assembly 148 is disposed in the interior volume 106 of the processing chamber 100 below the showerhead 130. The device support assembly 148 holds a device 144 during processing. A ring (e.g., a single ring) can cover a portion of the electrostatic chuck 150, and can protect the covered portion from exposure to plasma during processing. The ring can be silicon or quartz in one embodiment.

An inner liner can be coated on the periphery of the device support assembly 148. The inner liner can be a halogen-containing gas resist material such as those discussed with reference to the outer liner 116. In one embodiment, the inner liner can be fabricated from the same materials of the outer liner 116.

In one embodiment, the device support assembly 148 includes a pedestal 152 that supports an electrostatic chuck 150. The electrostatic chuck 150 further includes a thermally conductive base that can include one or more optional embedded heating elements, embedded thermal isolators and/or conduits to control a lateral temperature profile of the device support assembly 148. The electrostatic chuck 150 can further include multiple gas passages such as grooves, mesas and other surface features that can be formed in an upper surface of the electrostatic chuck 150. The gas passages can be fluidly coupled to a source of a heat transfer (or backside) gas such as He via holes drilled in the electrostatic chuck 150. In operation, the backside gas can be provided at controlled pressure into the gas passages to enhance the heat transfer between the electrostatic chuck 150 and a supported device 144. The electrostatic chuck 150 can include at least one clamping electrode controlled by a chucking power source.

In some embodiments, processing chamber 100 can be equipped with an optical detection component 160. Optical detection component 160 can detect optical signatures associated with materials in processing chamber 100. In some embodiments, an optical signature can correspond with a wavelength of a set of photons emitted by a plasma of the material in the processing chamber 100 during a process (e.g., an etch process). In some embodiments, optical detection component 160 can be an optical emission spectroscopy (OES) device. Optical detection component 160 can measure an amplitude of various wavelengths of photons emitted by one or more materials etched from the surface of device 144. In other or similar embodiments, optical detection component 160 can be a device configured to detect a specific wavelength of photons emitted by a single material etched from the surface of the device. It should be noted that, while the optical detection component 160 can detect and measure the wavelengths of photons emitted by one or more materials etched from the surface of the device, optical detection component 160 can also detect and measure the wavelengths of photons emitted by each material in the processing chamber 100 (e.g., etch plasma gases, coatings deposited on the walls of the processing chamber 100, etc.).

In some embodiments, optical detection component 160 can be displaced outside of processing chamber 100. In such embodiments, optical detection component 160 can be configured to detect optical signatures associated with materials in the processing chamber 100 from outside of processing chamber 100. Optical detection component 160 can be configured to detect optical signatures through a transparent portion (e.g., a window) embedded within a portion of chamber body 102. For example, optical detection component 160 can be configured to detect optical signatures through a window 162 embedded within a sidewall 108, a liner 116, bottom 110, and/or showerhead 130. Photons within processing chamber 100 can be transmitted to optical detection component 160 through a photon transmission cable 164, such as a fiber optic cable, through window 162. In other or similar embodiments, one or more components of optical detection component 160 can be displaced inside of processing chamber 100. In some implementations, a process performed within processing chamber 100 can be performed in a vacuum environment. As such, one or more components of optical detection component 160 that are configured to operate within a vacuum environment can be displaced inside of processing chamber 100.

In some embodiments, optical detection component 160 can be operatively coupled to a system controller (not shown). The system controller can be and/or include a computing device such as a personal computer, a server computer, a programmable logic controller (PLC), a microcontroller, and so on. The system controller can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. The system controller can include a data storage device (e.g., one or more disk drives and/or solid state drives), a main memory, a static memory, a network interface, and/or other components. The system controller can execute instructions to perform any one or more of the methodologies and/or embodiments described herein. The instructions can be stored on a computer readable storage medium, which can include the main memory, static memory, secondary storage and/or processing device (during execution of the instructions). The system controller can also be configured to permit entry and display of data, operating commands, and the like by a human operator.

Optical detection component 160 can transmit data relating to a detected optical signature to the system controller during an etch process performed at processing chamber 100. In some embodiments, optical detection component 160 can transmit measurements of amplitudes of wavelengths detected at a surface of device 144 to the system controller. The system controller, upon receipt of the optical signature data, can generate a spectrum associated with all optical signatures detected by optical detection component 160, such as spectrum 300 of FIG. 3. Further details regarding the spectrum are provided herein.

In some embodiments, a first layer can be deposited on a surface of device 144. The first layer can include two or more sense materials. A plasma of the sense material can be associated with an optical signature that is detectable by optical detection component 160. In some embodiments, a first sense material can be deposited at a first portion of a surface of device 144 and a second sense material can be deposited at a second portion of the surface of device 144. In some embodiments, a sense material can be a dielectric material, such as a silicon-based material (e.g., silicon oxide ($SiO_2$), silicon nitride ($Si_3N_4$), poly silicon, etc.). The sense material can also be a metallic material, such as a copper-based material or a tungsten-based material. In some embodiments, the sense material can be any materials that emit photons having a wavelength of between approximately 200 nanometers (nm) (i.e., ultra-violet photons) and approximately 1100 nm (i.e., near infra-red photons). can A second layer can be deposited on the first layer of device 144. In some embodiments, the second layer can include at least a first etch material and a second etch material. The first etch material can be deposited on the first sense material and the second etch material can be deposited on the second sense material. An etch material can be a material that is etched from the surface of device 144 during an etch process. In some embodiments, the etch material can be at least one of an aluminum (Al)-based material, indium tin oxide (ITO), a chromium (Cr)-based material, a gold (Au)-based material, a molybdenum (Mo)-based material, a platinum (Pt)-based material, a silicon (Si)-based material, a tantalum (Ta)-based material, a titanium (Ti)-based material, a copper (Cu)-based material, or a tungsten (W)-based material. In some embodiments, a third layer can also be placed on the second layer of device 144. The third layer can include a mask such as a hard mask (e.g., a metal mask) or a soft mask (e.g., tape, etc.). A mask can define one or more features that are to be etched onto the surface of device 144 (e.g., holes, patterns, etc.).

A processing device (e.g., the system controller, a processing device coupled to the system controller, etc.) can cause device 144 to be placed in processing chamber 100 and an etch process can be performed to etch the second layer of device 144 from the surface of device 144. The processing chamber can perform the etch process based on an initial set of etch parameter settings. In some embodiments, the initial set of etch parameter settings can include at least one of a temperature setting of the interior volume 106 of process chamber 100, a pressure setting of interior volume 106, a gas flow rate of gases provided by gas panel 158 to interior volume 106, a composition of gases provided by gas panel 158 to interior volume 106, and so forth.

During a first period of the etch process, optical detection component 160 does not detect any optical signatures emitting from the plasma of device 144 that are associated with the two or more sense materials of the first layer of device 144. During a second period of the etch process, optical detection component 160 can detect a first optical signature that is associated with the first sense material of the first layer of device 144. The detection of the first optical signature associated with the first sense material can indicate that etching of the first etch material is complete. During a third period of the etch process, optical detection component 160 can detect a second optical signature that is associated with the second sense material of the first layer of device 144. The detection of the second optical signature associated with the second sense material can indicate that etching of the second etch material is complete. Optical detection component 160 can transmit notifications to the processing device (e.g., the system controller) associated with the detected optical signatures and the indications that the etching of the first and second material is complete.

In response to receiving the notifications from optical detection component 160, the processing device can determine a first etch rate of the processing chamber based on a first amount of time between the initiation of the etch process and a first indication of completion of etching of the first etch material (i.e., the length of the first period of the etch process) and a thickness of the second layer prior to initiation of the etch process. The processing device can determine a second etch rate of the processing chamber based on a second amount of time between the initiation of the etch process (i.e., the length of the first period of the etch process and the second period of the etch process) and the thickness of the second layer prior to initiation of the etch process. The processing device determines a selectivity of the etch process performed at the processing chamber based on the first etch rate and the second etch rate. As previously described, an etch material selectivity can refer to a ratio between two etch rates measured for two etch materials deposited on a surface of device 144. As such, the processing device can determine the selectivity of the etch process performed at the processing chamber based on a ratio between the first etch rate and the second etch rate.

The processing device can determine an optimized set of etch parameter settings to be applied at processing chamber 100 during subsequent etch processes can be determined based on the selectivity of the etch process. In some embodiments, the selectivity of the etch process can be compared to a threshold selectivity. The threshold selectivity can correspond to a target selectivity to be achieved during an etch process performed at the processing chamber. In response to determining that the selectivity of the etch process satisfies the threshold selectivity, the processing device can set the optimized set of etch parameter settings to be applied at processing chamber 100 during a subsequent etch process as the initial set of etch parameter settings applied at processing chamber 100 during the etch process. In response to determining that the selectivity of the etch process does not satisfy the threshold selectivity, the processing device can determine the optimized set of etch parameter settings that are estimated to cause the selectivity of the etch process to approximately match the threshold selectivity.

In some embodiments, the processing device can also determine an etch rate uniformity based on one or more optical signatures detected by optical detection component 160 during the etch process performed at processing chamber 100. A third sense material can be deposited at a third portion of the surface of device 144. The first etch material can also be deposited on the third sense material, in accordance with previously described embodiments. In some embodiments, a fourth sense material can also be deposited at a fourth portion of the surface of device 144. In such embodiments, the second etch material can be deposited on the fourth sense material, in accordance with previously described embodiments.

In some embodiments, the first portion of the surface of device 144 covered by the first sense material and the first etch material and the second portion of the surface of device 144 covered by the second sense material and the second etch material can be included in a first section of the surface of device 144. Similarly, the third portion of the surface of device 144 covered by the third sense material and the first etch material and the fourth portion of the surface of device 144 covered by the fourth sense material and the fourth etch material can be included in a second section of the surface of device 144. For example, the first portion and the second portion can be included in an outer diameter of the surface of device 144 and the third portion and the fourth portion can be included in an inner diameter of the surface of device 144. By including the first portion and the second portion in a first section of the surface of device 144 and the third portion and the second portion in a second section of the surface of device 144, a uniformity of an etch rate for a particular etch material can also be determined across the surface of device 144 (i.e., between the outer diameter and the inner diameter) along with the selectivity of the etch process between the first etch material and the second etch material.

During a first period of the etch process, optical signatures associated with the first sense material, the second sense material, the third sense material, and the fourth sense material are not detected by optical detection component 160. During a second period of the etch process, a first optical signature associated with the first sense material can be detected by optical detection component 160. Similarly, a second optical signature associated with the second sense material can be detected during a third period of the etch process, a third optical signature associated with the third sense material can be detected during a fourth period of the etch process, and a fourth optical signature associated with the fourth etch material can be detected during a fifth period of the etch process.

The detection of the first optical signature can indicate that etching is complete at the first portion of the surface of device 144. Similarly, the detection of the third optical signature can indicate that etching is complete at the third portion of the surface of device 144. In some embodiments, the processing device can determine i that the etch rate of processing chamber 100 is not uniform if the amount of time between the beginning of the second period (i.e., the detection of the first optical signature) and the beginning of the fourth period (i.e., the detection of the third optical signature) exceeds a first threshold amount of time. If the amount of time between the beginning of the second period and the beginning of the fourth period exceed the first threshold amount of time, the processing device can determine the first etch material of the second layer is not etched uniformly (e.g., the first etch material at the outer diameter of the surface of device 144 can be etched before the first etch material at the inner diameter of the surface of device 144). The processing device can determine that the etch rate of processing chamber 100 is uniform if the amount of time between the beginning of the second period and the beginning of the fourth period does not exceed the first threshold amount of time. If the amount of time between the beginning of the second period and the beginning of the fourth period does not exceed the first threshold amount of time, the first etch material of the second layer can be etched uniformly (i.e., the first etch material at the outer diameter of the surface of device 144 is etched at approximately the same rate as the first etch material at the inner diameter of the surface of device 144).

The detection of the second optical signature can indicate that etching is complete at the second portion of the surface of device 144. Similarly, the detection of the fourth optical signature can indicate that etching is complete at the fourth portion of the surface of device 144. In some embodiments, the processing device can be determine that the etch rate of processing chamber 100 is not uniform if the amount of time between the beginning of the third period (i.e., the detection of the second optical signature) and the beginning of the fifth period (i.e., the detection of the fourth optical signature) exceeds a second threshold amount of time. If the amount of time between the beginning of the third period and the beginning of the fifth period exceed the second threshold amount of time, the processing device can determine the second etch material of the second layer is not etched uniformly (e.g., the second etch material at the outer diameter of the surface of device 144 can be etched before the second etch material at the inner diameter of the surface of device 144). The processing device can determine that the etch rate of processing chamber 100 is uniform if the amount of time between the beginning of the third period and the beginning of the fifth period does not exceed the second threshold amount of time. If the amount of time between the beginning of the third period and the beginning of the fifth period does not exceed the second threshold amount of time, the processing device can determine the second etch material of the second layer can be etched uniformly (i.e., the second etch material at the outer diameter of the surface of device 144 is etched at approximately the same rate as the second etch material at the inner diameter of the surface of device 144).

As described above, the processing device can determine an optimized set of etch parameter settings to be applied at processing chamber 100 during etch processes based on the selectivity of the etch process. In some embodiments, the processing device can further determine the optimized set of etch parameter settings by determining whether the etch rate for the first etch material and/or the second etch material is uniform across the surface of device 144. For example, in response determining that the etch rate for the first etch material is uniform across the surface of device 144, the processing device can set the optimized set of parameter settings as the initial set of etch parameter settings applied at processing chamber 100 during the etch process. In response to determining that the etch rate for the first etch material is not uniform across the surface of device 144, the processing device can determine the optimized set of parameter settings such to cause the etch rate for the first etch material to be approximately uniform.

Figure 2B:
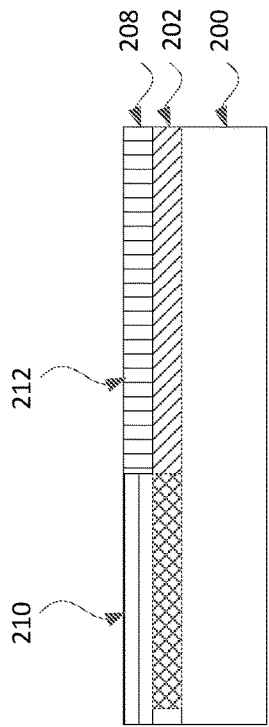
FIG. 2A and FIG. 2B depict an example device for in-situ detection of an etch material selectivity of a processing chamber, according to aspects of the present disclosure.
Figure 2D:
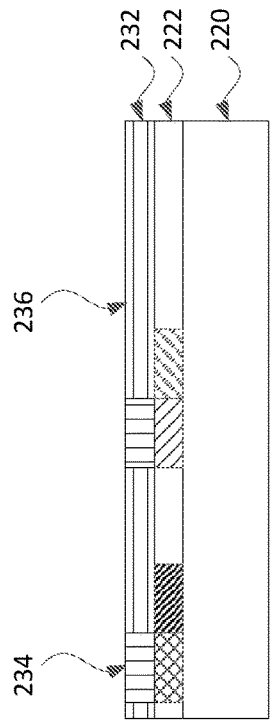
FIG. 2C and FIG. 2D depict another example device for in-situ detection of an etch material selectivity of a processing chamber, according to aspects of the present disclosure.
Figure 2A:
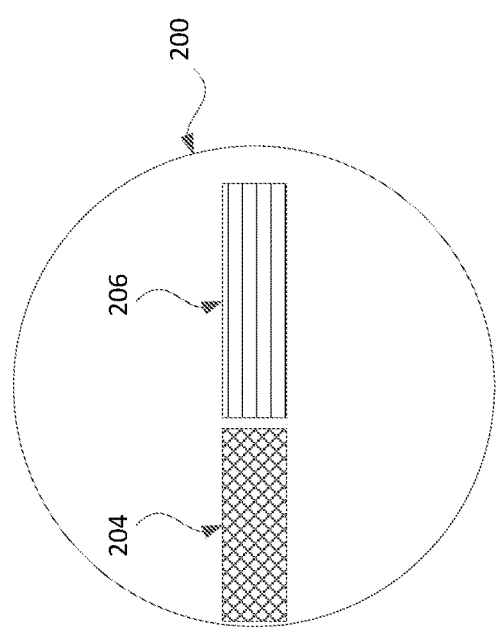

FIGS. 2A-2H depict example devices for in-situ detection of an etch material selectivity and/or an etch rate uniformity of an etch process performed at a processing chamber of an electronics processing system, according to aspects of the present disclosure. Referring to FIGS. 2A and 2B, a first layer 202 can be deposited on a surface of a device 200. First layer 202 can include a first sense material 204 and a second sense material 206. First sense material 204 can be deposited at a first portion of the surface of device 200 and second sense material 206 can be deposited at a second portion of the surface of device 200. Each of the first sense material 204 and the second sense material 206 can be materials associated with an optical signature, in accordance with previously described embodiments. In some embodiments, an optical detection component, such as optical detection component 160 described with respect to FIG. 1, can detect the optical signature during an etch process at the processing chamber. In such embodiments, the optical signature can be associated with a wavelength of a set of photons emitted by a plasma of the sense material, as detected by the optical detection component. First sense material 204 can be associated with a first optical signature and second sense material 206 can be associated with a second optical signature.

A second layer 208 can be deposited on first layer 202. Second layer 208 can include at least a first etch material 210 and a second etch material 212. First etch material 210 can be deposited on first sense material 204 and second etch material 212 can be deposited on second sense material 206. When processed in a processing chamber, such as an etching chamber, each of the first etch material 210 and the second etch material 212 can be etched away, thus exposing first layer 202. In some embodiments, a third layer (not shown) can be positioned on second layer 208. The third layer can include a mask, such as a hard mask (e.g., a metal mask) or a soft mask (e.g., tape, etc.), that defines features to be etched onto the surface of device 200. In some embodiments, each layer deposited on the surface of the device 200 can be deposited on an entire surface of the device 200. For example, at least one of first layer 202, second layer 208, or the third layer can be deposited to cover the entire surface of device 200.

During an etch process, the optical detection component can detect one or more optical signatures emitted by a plasma of materials within the processing chamber. As described previously with respect to FIG. 1, the optical detection component can transmit data relating to detected optical signatures to a processing device (e.g., a system controller) during the etch process. The processing device, upon receipt of the optical signature data, can generate a spectrum associated with all optical signatures detected by the optical detection component, such as spectrum 300 of FIG. 3.

Figure 3:
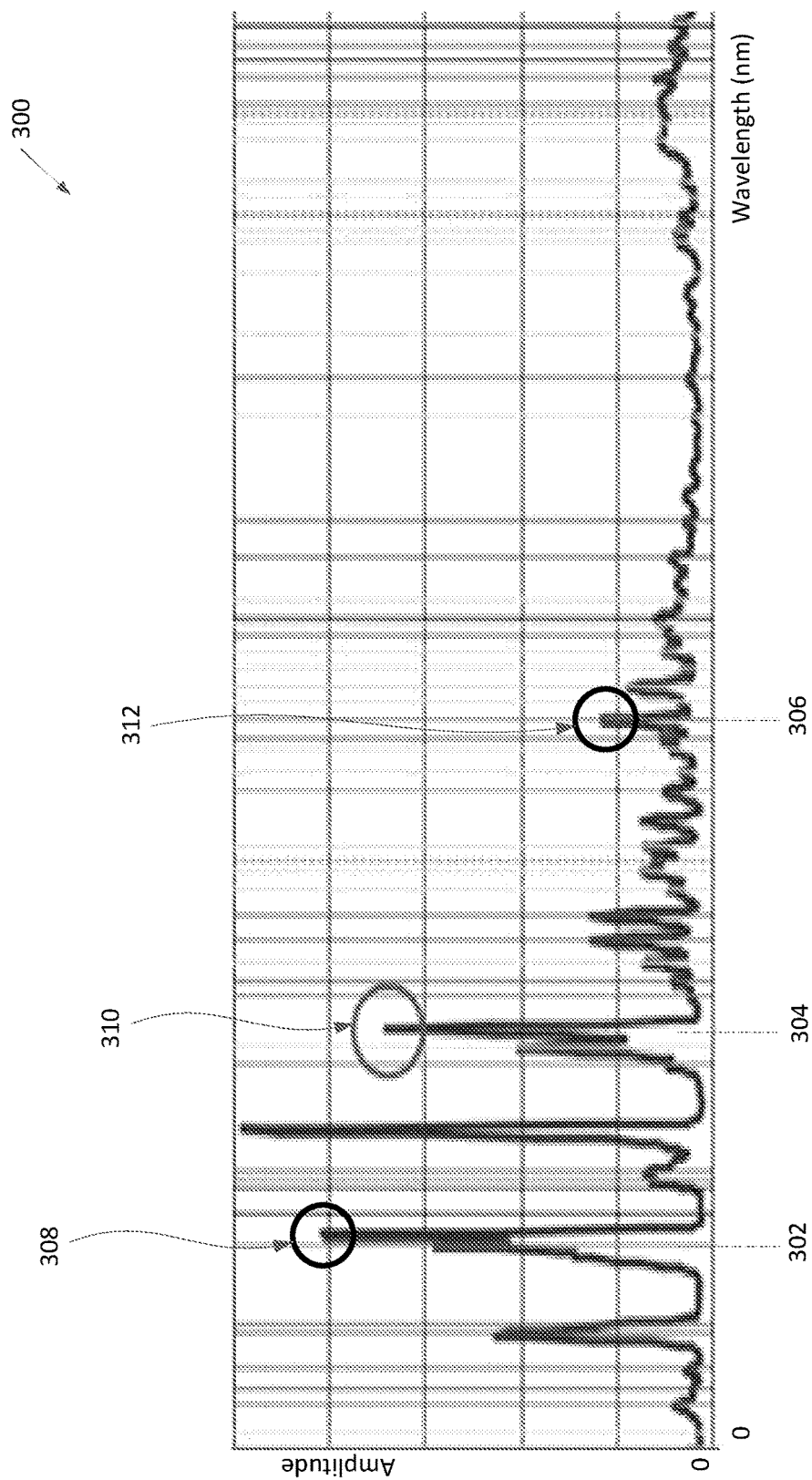
FIG. 3 depicts an example spectrum of an optical detection component of a processing chamber, according to aspects of the present disclosure.

FIG. 3 depicts an example spectrum 300, according to aspects of the present disclosure. Spectrum 300 can be generated by processing device (e.g., a system controller of an electronics processing system) upon receipt of optical signature data collected by an optical detection component of a processing chamber. As described previously, the optical detection component can measure the amplitude (i.e., a number of photons) of wavelengths emitted by a plasma of materials in the processing chamber. A particular wavelength can correspond to a material of a first layer deposited on a surface of the device. For example, first sense material 204 deposited on the first portion of the surface of device 200 can correspond with wavelength 302 and sense material 206 deposited on the second portion of the surface of device 200 can correspond with wavelength 304. Spectrum 300 can include optical signatures of materials in the processing chamber that are included in first layer 202 of device 200. For example, wavelength 306 can correspond with a material used for a component of the processing chamber, as described with respect to FIG. 1.

As described previously, the optical detection component can measure an amplitude of each optical signature detected within the processing chamber. Each amplitude can be represented by a peak of spectrum 300. For example, the amplitude of wavelength 302 can be represented by peak 308, the amplitude of wavelength 304 can be represented by peak 310, and the amplitude of wavelength 306 can be represented by peak 312. The amplitude of each optical signature can change during the etch process. For example, as more of the first sense material 204 of the first layer 202 is exposed during the etch process, the amplitude of wavelength 302 can increase. Similarly, as more of the second sense material 206 is exposed during the etch process, the amplitude of wavelength 304 can increase. As wavelength 306 is not associated with a material that is deposited on the surface of device 200, the amplitude of wavelength 306 can remain approximately constant during the etch process. Optical detection component can record data corresponding to the detected optical signatures and the measured amplitudes of each optical signature for various points in time during the etch process (e.g., seconds). The processing device can use the recorded data to generate a graph indicating a change in an amplitude of an optical signature for a particular material during the etch process, as illustrated with respect to FIGS. 4-5.

Figure 4:
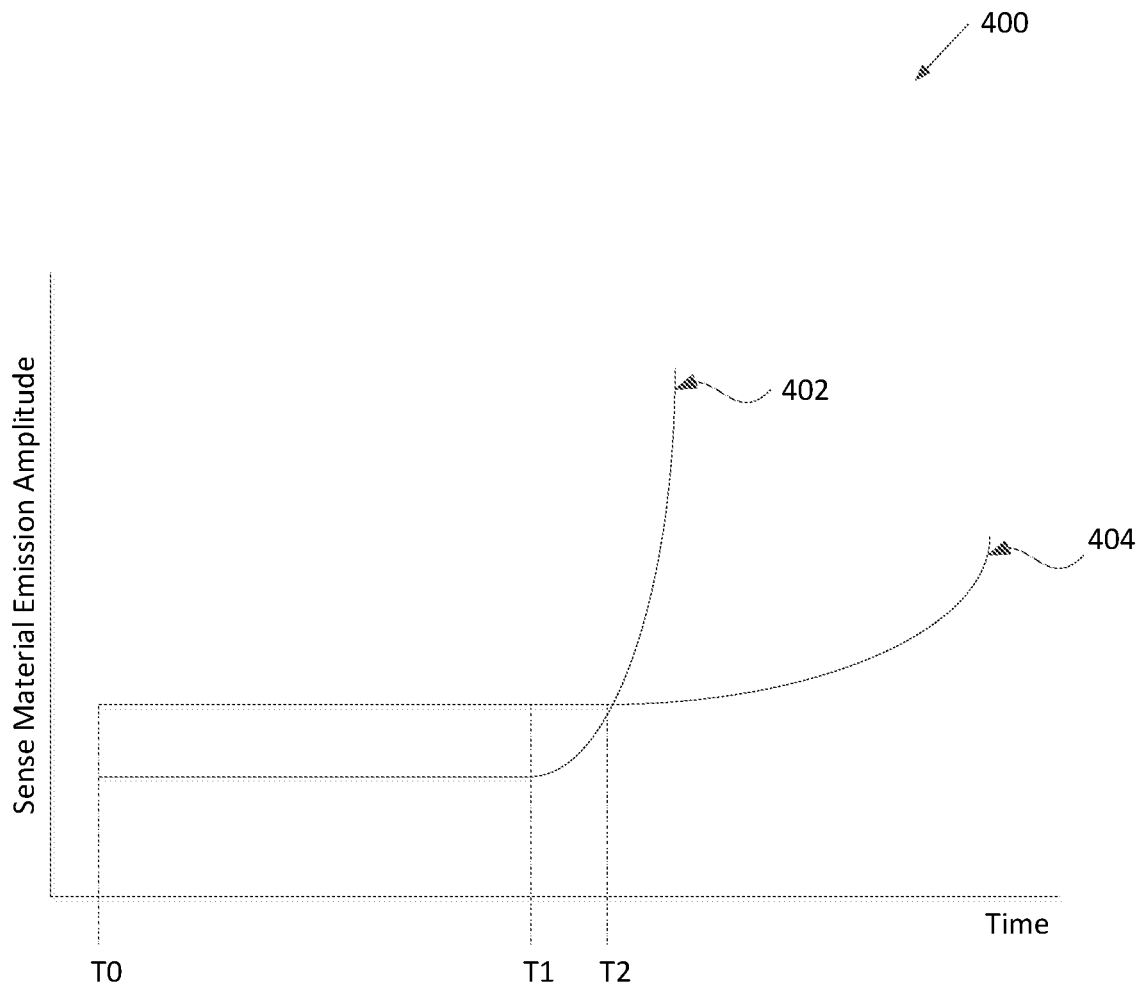
FIG. 4 depicts a graph indicating an emission amplitude of an optical signature associated with multiple sense materials over time, according to aspects of the present disclosure.

FIG. 4 depicts a graph 400 indicating an emission amplitude of optical signatures associated with two or more sense materials over time, according to aspects of the present disclosure. An optical detection component can detect a first optical signature associated with a first sense material and a second optical signature associated with a second sense material during an etch process performed for a device, such as device 200 of FIGS. 2A and 2B. A processing device (e.g., a system controller) can generate graph 400 can based on data from a spectrum, such as spectrum 300 of FIG. 3. An amplitude of an optical signature associated with each sense material during the etch process can be represented by a distinct curve on graph 400. For example, the amplitude of the optical signature associated with first sense material 204 of the first layer 202 of device 200 can be represented by curve 402, while the amplitude of the optical signature associated with second sense material 206 of the first layer 202 can be represented by curve 404.

The etch process can begin at time T0. During a first period of the etch process (from time T0 to time T1), a first etch material 210 of a second layer 208 deposited on the surface of device 200 can be etched away. The first sense material 204 and the second sense material 206 of the first layer 202 is not be detected during the first period of the etch process. At an initial time during the first period of the etch process, the first etch material 210 can be detected based an optical signature associated with the etch material, in accordance with previously described embodiments. At a subsequent time during the first period, an amplitude of the optical signature associated with the first etch material 210 can decrease. In some embodiments, the optical signature associated with the etch material can continue to decrease until approximately an initial time of a second time period of the etch process (from time T1 to time T2).

During the second period of the etch process, the optical detection component can detect the first sense material 204 can be detected. The second period can begin at a time at which the amplitude of the optical signature associated with the first etch material 210 no longer continues to decrease (i.e., remains constant). In other or similar embodiments, the second period can begin at a time at which the amplitude of the optical signature associated with the first sense material 204 begins to increase.

The optical detection component can detect the first sense material 204 based on an optical signature associated with the first sense material 204, in accordance with previously described embodiments. The detection of the first sense material 204 can be an indication that etching of the first etch material 210 is complete. During a third period of the etch process (beginning at time T2), the second sense material 206 of the first layer 202 can be detected by the optical detection component. The optical detection component can detect the second sense material 206 based on an optical signature associated with the second sense material 206, in accordance with previously described embodiments. The detection of the second sense material 206 can be an indication that etching of the second etch material 212 is complete.

A processing device can determine a first etch rate and a second etch rate for the first etch material 210 and the second etch material 212. The processing device can determine the first etch rate based on an amount of time between an initiation of the etch process and a detection of a first indication that etching of the first etch material 210 is complete (i.e., the amount of time of the first period of the etch process), and a thickness of second layer 208. The processing device can determine the second etch rate based on an amount of time between the initiation of the etch process and a detection of a second indication that etching of the second etch material 212 is complete (i.e., the amount of time of the first period and the second period of the etch process), and the thickness of the second layer 208. The processing device can determine an etch material selectivity for the first etch material 210 and the second etch material 212 in accordance with previously described embodiments. The processing device can determine an optimized set of etch parameter settings based on the determined etch material selectivity, in accordance with previously described embodiments.

Figure 2C:
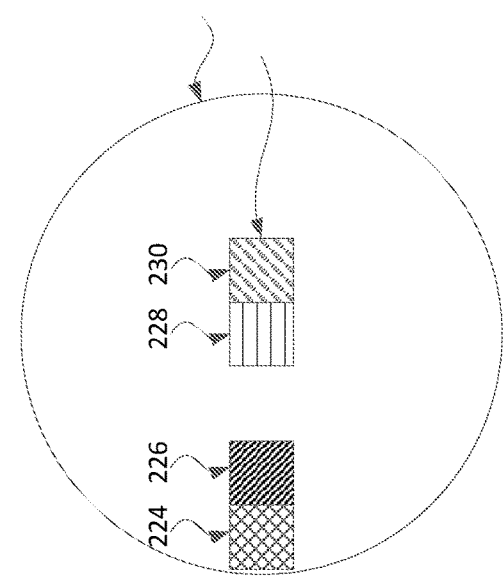

Referring now to FIGS. 2C and 2D, a first layer 222 can be deposited on a surface of a device 220. First layer 222 can include two or more sense materials. For example, first layer 222 can include at least a first sense material 224, a second sense material 226, a third sense material 228, and a fourth sense material 230 as illustrated. First sense material 224, second sense material 226, third sense material 228, and fourth sense material 230 can each be deposited on distinct portions of the surface of device 220. In some embodiments, one of more portions of the surface of device 220 can be included in a distinct section of the surface of device 220. For example, the first portion covered by first sense material 224 and the second portion covered by second sense material 226 can be included at an outer diameter of the surface of device 220. The third portion covered by third sense material 228 and the fourth portion covered by fourth sense material 230 can be included at an inner diameter of the surface of device 220.

First sense material 224, second sense material 226, third sense material 228, and fourth sense material 230 can each be associated with a distinct optical signature. Each optical signature can correspond to a specific wavelength that is detectable by an optical detection component, such as optical detection component 160 described with respect to FIG. 1. By including the first portion and the second portion in a first section of the surface of device 220 and the third portion and the fourth portion in a second section of the surface of device 220, a uniformity of an etch rate for a first etch material 234 and a second etch material 236 can be determined across the surface of device 220 (i.e., between the outer diameter and the inner diameter) along with the selectivity of the etch process between the first etch material 234 and the second etch material 236.

A second layer 232 can be deposited on first layer 222. Second layer 232 can include the first etch material 234 and the second etch material 236. When placed in a processing chamber of an electronics processing system, such as an etching chamber, the etch materials of second layer 232 can be etched away, thus exposing the sense materials of first layer 222. In some embodiments, the first etch material 234 can be deposited on the first sense material 224 and the third sense material 228 (i.e., at the outer diameter of the surface of device 220 and the inner diameter of the surface of device 220). In other or similar embodiments, the second etch material 236 can be deposited on the second sense material 226 and the fourth sense material 230. (i.e., at the outer diameter of the surface of device 220 and the inner diameter of the surface of device 220). In some embodiments, a third layer (not shown) can be positioned on second layer 232. The third layer can include a mask, such as a hard mask or a soft mask, that defines features on the surface of device 220.

Device 220 can be used to determine a selectivity of first etch material 234 and second etch material 236, and whether an etch rate of a processing chamber is uniform across the surface of device 220. The selectivity of the first etch material 234 and the second etch material 236 can be determined in accordance with previously described embodiments. By including the first portion and the second portion in a first section of the surface of device 220 and the third portion and the fourth portion in a second section of the surface of device 220, a uniformity of an etch rate for a first etch material 234 and a second etch material 236 can be determined across the surface of device 220 (i.e., between the outer diameter and the inner diameter) along with the selectivity of the etch process between the first etch material 234 and the second etch material 236.

Figure 5:
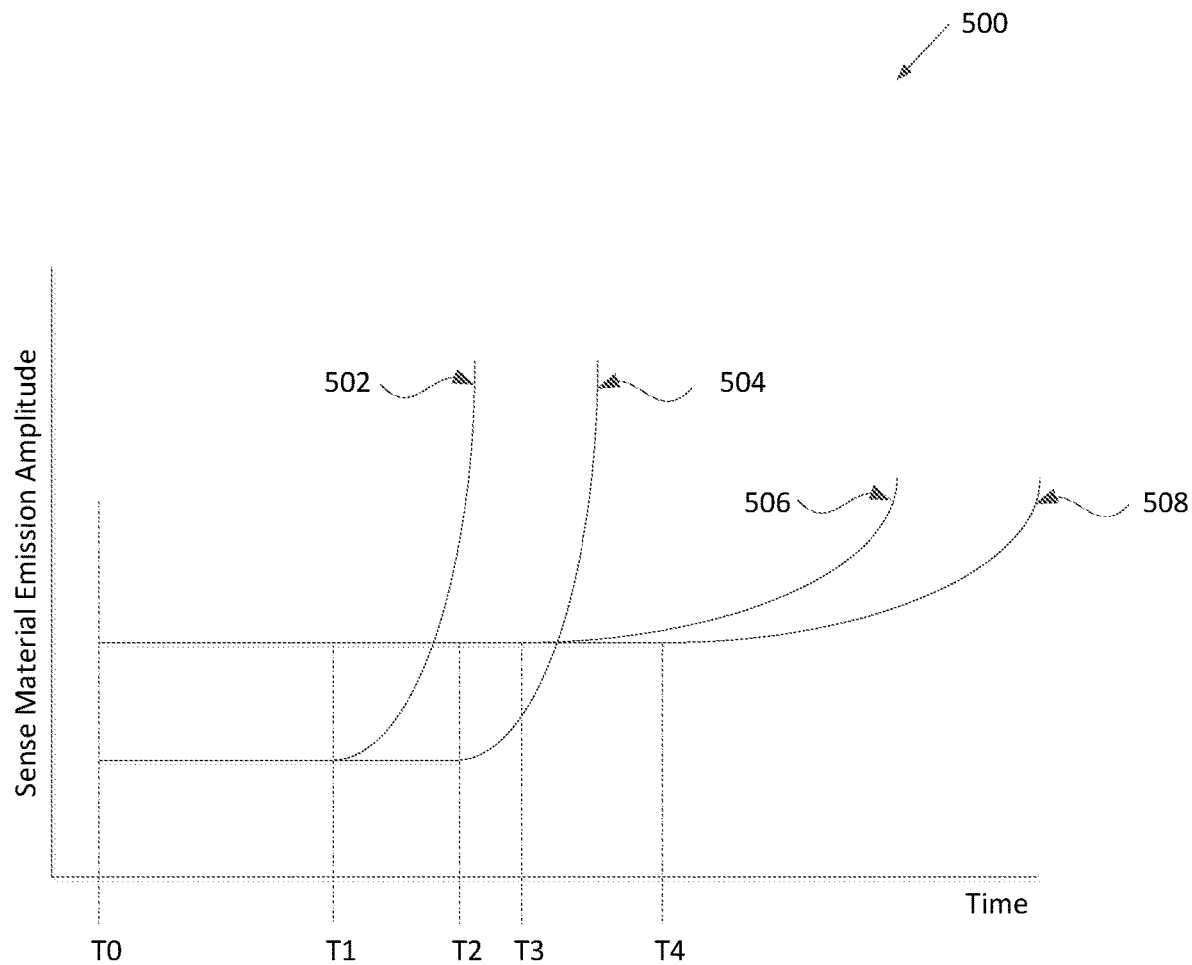
FIG. 5 depicts another graph indicating an emission amplitude of an optical signature associated with multiple sense materials over time, according to aspects of the present disclosure.

FIG. 5 depicts another graph 500 indicating an emission amplitude of an optical signature associated with multiple sense materials over time, according to aspects of the present disclosure. Graph 500 can be generated in accordance with embodiments described with respect to FIG. 4. An optical detection component can detect one or more sense materials during an etch process performed for a device, such as device 220 of FIGS. 2C and 2D. An amplitude of an optical signature associated with each sense material during the etch process can be represented by a distinct curve on graph 500.

For example, the amplitude of a first optical signature associated with first sense material 224 of the first layer 222 of device 220 can be represented by curve 502, the amplitude of a second optical signature associated with second sense material 226 can be represented by curve 504, the amplitude of a third optical signature associated with third sense material 228 can be represented by curve 506, and the amplitude of a fourth optical signature associated with fourth sense material 230 can be represented by curve 508.

The etch process can begin at time T0. During a first period of the etch process (from time T0 to time T1), the first etch material 234 and the second etch material 236 of second layer 232 can be etched away. The sense materials of the first layer 222 is not detected during the first period of the etch process. During a second period of the etch process (from time T1 to time T2), the optical detection component detects the first sense material 224 of the first layer 222. The optical detection component detects the first sense material 224 based on the first optical signature associated with the first sense material 224, in accordance with previously described embodiments. Similarly, the optical detection component detects the third sense material 228 based on the third optical signature detected during a second period of the etch process (from time T2 to time T3).

In some embodiments, a processing device (e.g., a system controller) can determine whether the etch rate is uniform across the surface of device 200 based on a threshold amount of time between an instance the first sense material 224 is first detected by the optical detection component and an instance the third sense material 228 is first detected by the optical detection component. The duration of time between the instance the first sense material 224 is first detected and the instance the third sense material 228 is first detected can correspond with the second period of the etch process (from time T1 to time T2). The processing device can determine that a first etch rate of the processing chamber is uniform across the surface of device 220 in response to determining that the amount of time between the instance the first sense material 224 is first detected and the instance the third sense material 228 is first detected satisfies the threshold duration of time.

In an illustrative example, the threshold amount of time can be approximately 0.3 seconds. Time T1 of graph 500 can indicate approximately 1 second after the initiation of the etch process at a processing chamber (e.g., at T0). Time T2 of graph 500 can indicate approximately 1.5 seconds after the initiation of the etch process. The duration of time between time T1 and time T2 can be approximately 0.5 seconds. As 0.5 seconds is more than the threshold duration of time of approximately 0.3 seconds, the processing device can determine that the first etch rate of the processing chamber is not uniform across the surface of device 220. In such embodiments, an optimized set of etch parameter settings can be determined so to decrease the duration of time between time T1 and time T2.

In other or similar embodiments, the processing device can determine whether the etch rate is uniform across the surface of device 200 based on a threshold amount of time between an instance the second sense material 226 is first detected by the optical detection component and an instance the fourth sense material 230 is first detected by the optical detection component. The duration of time between the instance the second sense material 226 is first detected and the instance the fourth sense material 230 is first detected can correspond with the second period of the etch process (from time T3 to time T4). The processing device can determine that a first etch rate of the processing chamber is uniform across the surface of device 220 in response to determining that the amount of time between the instance the second sense material 226 is first detected and the instance the fourth sense material 230 is first detected satisfies the threshold duration of time.

Figure 2F:
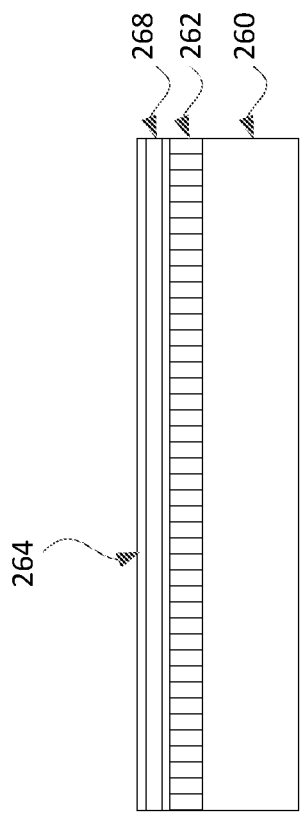
FIG. 2E and FIG. 2F depict another example device for in-situ detection of an etch material selectivity of a processing chamber, according to aspects of the present disclosure.
Figure 2E:
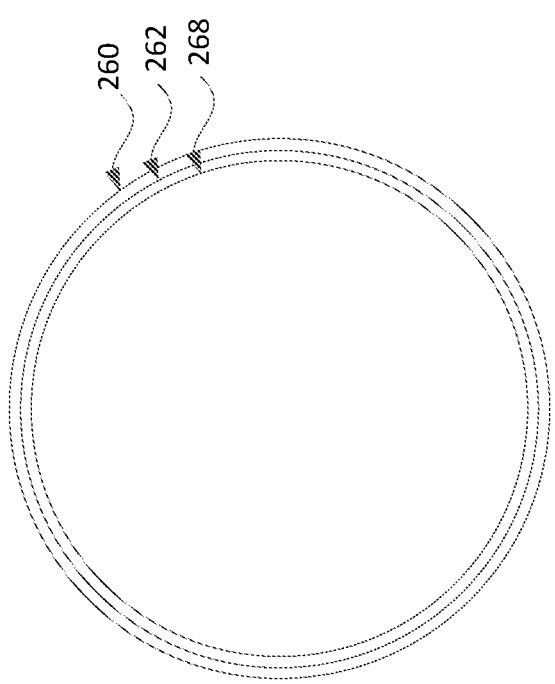

FIGS. 2E and 2F depict another example device 260 for in-situ detection of an etch material selectivity of an etch process performed at a processing chamber of an electronics processing system, according to aspects of the present disclosure. A first layer 262 can be deposited at the surface of device 260. In some embodiments, the first layer 262 can include a first etch material 264. The first etch material 264 can be associated with a first optical signature that is detectable by an optical detection component of the processing chamber, such as optical detection component 160 of FIG. 1. A second layer 268 can be deposited on first layer 262. The second layer 268 can include a second etch material 270. The second etch material 270 can be associated with a second optical signature that is detectable by the optical detection component of the processing chamber.

Device 260 can be placed in the processing chamber and an etch process can be performed, in accordance with previously described embodiments. During a first period of the etch process, optical detection component detects the second optical signature associated with the second etch material 270. During a second period of the etch process, the optical detection component no longer detects the second optical signature and the first optical signature associated with the first etch material 264 is detected. During a third period of the etch process, the optical detection component cannot detect the first optical signature.

A processing device can determine a first etch rate for the first etch material 264 based on amount of time between a first instance of a detection of the first etch material 264 and an instance at which the first etch material 264 was no longer detected by the optical detection component (i.e., the amount of time between the second period and the third period), and a thickness of the first layer 262. The processing device can determine a second etch rate for the second etch material 270 based on an amount of time between a first instance of a detection of the second etch material 270 and an instance at which the second etch material 270 was no longer detected by the optical detection component (i.e., the amount of time between the first period and the second period), and a thickness of the second layer 268. The processing device can determine a selectivity of the etch process based on the first etch rate and the second etch rate, in accordance with previously described embodiments. The processing device can use the selectivity of the etch process to determine an optimized set of parameter settings, in accordance with previously described embodiments.

FIGS. 2G and 2H depict another example device 280 for in-situ detection of an etch material selectivity and/or an etch rate uniformity of an etch process performed at a processing chamber of an electronics processing system, according to aspects of the present disclosure. A first layer can be formed on a surface of device 280. The first layer can include one or more test coupons 282 where each test coupon is placed at a distinct portion of the surface of device 280. Each test coupon 282 can include at least a first layer 284 and a second layer 286. First layer 284 can be deposited on a first surface of a test coupon 282 and second layer 286 can be deposited on first layer 284. First layer 284 can be composed of a sense material. In some embodiments, the first layer 284 of each test coupon 282 can be composed of a distinct sense material. Second layer 286 can be composed of an etch material. In some embodiments, a first set of test coupons 282 can include a second layer 286 composed of a first etch material 288 while a second set of test coupons 282 can include a second layer 286 composed of a second etch material 290. In some embodiments, a third layer (not shown) can be positioned on second layer 268. The third layer can include a mask, such as a hard mask or a soft mask, that defines features on the surface of each test coupon 282.

When device 280 is placed in a processing chamber of an electronics processing system, such as an etching chamber, the etch material (i.e., first etch material 288 and/or second etch material 290) of second layer 286 can be etched away, thus exposing first layer 284. An etch rate can be determined for each test coupon 282 of device 280. A processing device can determine an etch rate selectivity and/or an etch rate uniformity for the etch process in accordance with previously described embodiments.

In some embodiments, an edge of each test coupon 282 can be encapsulated with a protective material to reduce and/or prevent the edge of the etch material of second layer 286 and/or the sense material of first layer 284 from etching away, thus interfering with the optical detection component's ability to detect the optical signature of the sense material of first layer 284. The protective material can be composed of a polymeric material, such as an epoxy or a polyamide. In some embodiments, the first layer 284 can be encapsulated with a protective material. In other or similar embodiments, the first layer 284 and the second layer 286 can be encapsulated with the protective material.

Figure 6:
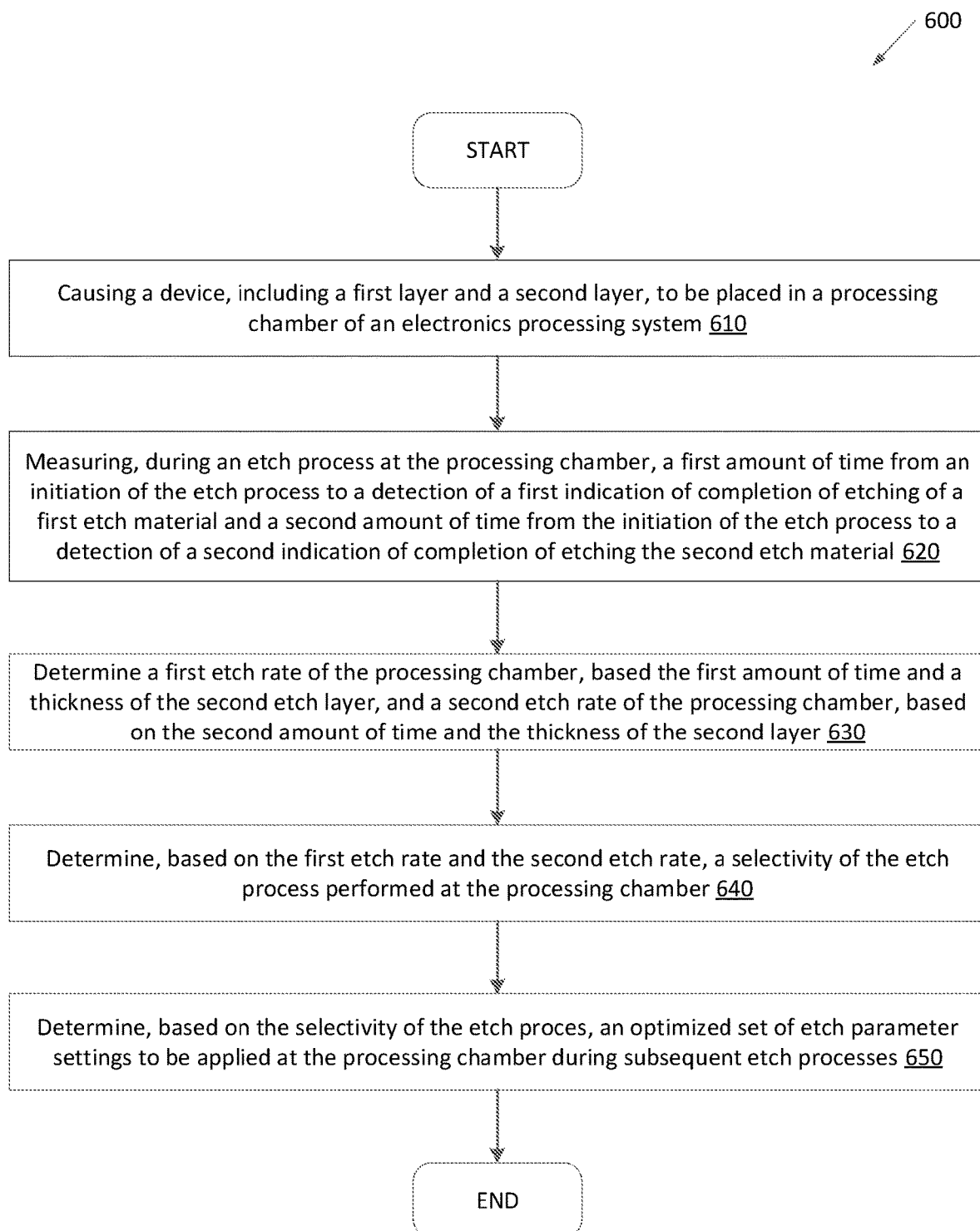
FIG. 6 illustrates a method for detecting an etch material selectivity of a processing chamber, according to aspects of the present disclosure.

FIG. 6 illustrates a method 600 for detecting an etch material selectivity of a processing chamber, according to aspects of the present disclosure. At block 610, a device is caused to be placed in a processing chamber of an electronics processing system. The device can include a first layer and a second layer. The first layer can include a first sense material deposited on a first portion of the surface of the device and a second sense material deposited on a second portion of the surface of the device. The second layer can include a first etch material deposited on the first sense material and a second etch material deposited on the second sense material. At block 620, a first amount of time from an initiation of the etch process to a detection of a first indication of completion of etching of a first etch material and a second amount of time from the initiation of the etch process to a detection of completion of etching of the second etch material is measured. At block 630, a first etch rate is determined based on the first amount of time and a thickness of the second etch layer and a second etch rate is determined based on the second amount of time and the thickness of the second layer. At block 640, a selectivity of the etch process performed at the processing chamber is determined based on the first etch rate and the second etch rate. At block 650, an optimized set of etch parameter settings to be applied at the processing chamber during subsequent etch processes is determined based on the selectivity of the etch process.

In some embodiments, multiple etch rates can be obtained for one or more materials deposited on the surface of the device. For example, one or more operations of method 600 can be performed multiple times to determine multiple values for the first etch rate and/or the second etch rate. Each determined value can be used to determine the etch rate uniformity of the processing chamber over an extended time period.

Figure 7:
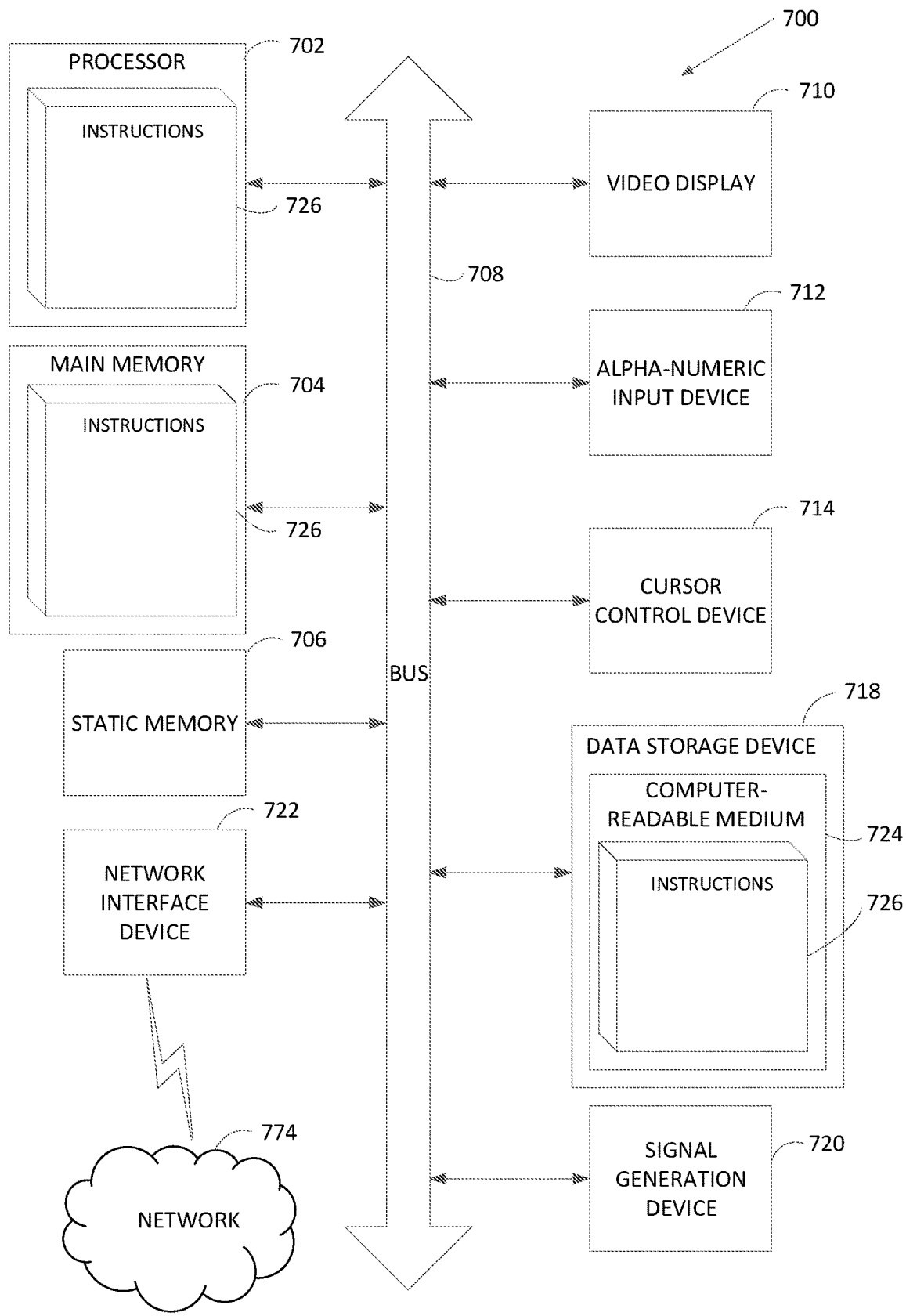
FIG. 7 is a block diagram illustrating a computer system, according to certain embodiments.

FIG. 7 is a block diagram illustrating a computer system 700, according to certain embodiments. In some embodiments, computer system 700 can be the system controller described with respect to FIG. 1. In some embodiments, computer system 700 can be connected (e.g., via a network, such as a Local Area Network (LAN), an intranet, an extranet, or the Internet) to other computer systems. Computer system 700 can operate in the capacity of a server or a client computer in a client-server environment, or as a peer computer in a peer-to-peer or distributed network environment. Computer system 700 can be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 700 can include a processing device 702, a volatile memory 704 (e.g., random access memory (RAM)), a non-volatile memory 706 (e.g., read-only memory (ROM) or electrically-erasable programmable ROM (EEPROM)), and a data storage device 718, which can communicate with each other via a bus 708.

Processing device 702 can be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 700 can further include a network interface device 722 (e.g., that communicates via network 774). Computer system 700 also can include a video display unit 710 (e.g., an LCD), an alphanumeric input device 712 (e.g., a keyboard), a cursor control device 714 (e.g., a mouse), and a signal generation device 720.

In some implementations, data storage device 718 can include a non-transitory computer-readable storage medium 724 on which can store instructions 726 encoding any one or more of the methods or functions described herein, including instructions for implementing methods described herein (e.g., performing method 600 of FIG. 6).

Instructions 726 can also reside, completely or partially, within volatile memory 704 and/or within processing device 702 during execution thereof by computer system 700, hence, volatile memory 704 and processing device 702 can also constitute machine-readable storage media.

While computer-readable storage medium 724 is shown in the illustrative examples as a single medium, the term "non-transitory computer-readable storage medium" shall include a single medium or multiple media (e.g., a centralized or distributed database, and/or associated caches and servers) that store the one or more sets of executable instructions. The term "non-transitory computer-readable storage medium" shall also include any tangible medium that is capable of storing or encoding a set of instructions for execution by a computer that cause the computer to perform any one or more of the methods described herein. The term "non-transitory computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "scanning," "moving," "causing," "performing," "removing," "placing," "directing," "determining," "disposing," "actuating," "locating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
  causing a device to be placed in a processing chamber of an electronics processing system, wherein the device comprises a first layer deposited on a surface of the device and a second layer deposited on the first layer, wherein the first layer comprises a first sense material deposited on a first portion of the surface and a second sense material deposited on a second portion of the surface, and wherein the second layer comprises a first etch material deposited on the first sense material and a second etch material deposited on the second sense material;
  measuring, during an etch process performed for the device at the processing chamber, a first completion time for etching the first etch material based on a first optical signature of the first sense material during the etch process, and a second completion time for etching the second etch material based on a second optical signature of the second sense material during the etch process, wherein the etch process etches the second layer of the device based on an initial set of etch parameter settings;
  determining a first etch rate of the processing chamber, based on the first completion time and a thickness of the second layer of the etched device, and a second etch rate of the processing chamber, based on the second completion time and the thickness of the second layer of the etched device;
  determining, based on the first etch rate and the second etch rate, a selectivity of the etch process performed at the processing chamber; and
  determining, based on the selectivity of the etch process, an optimized set of etch parameter settings to be applied at the processing chamber during subsequent etch processes.

2. The method of claim 1, wherein the first optical signature and the second optical signature can be detected by an optical detection component of the processing chamber.

3. The method of claim 2, wherein the first layer further comprises a third sense material deposited at a third portion of the surface, wherein the third sense material is associated with a third optical signature that is detected by the optical detection component during the etch process.

4. The method of claim 3, further comprising:
  measuring, during the etch process, a third completion time for etching of the first etch material at the third portion of the surface of the device;
  determining, based on the measured third completion time and the thickness of the second layer, a third etch rate of the processing chamber; and
  determining, based on a difference between the first etch rate and the third etch rate, that an overall etch rate associated with the first etch material is not uniform across the surface of the device, wherein the optimized set of etch parameter settings is determined to cause the overall etch rate of the processing chamber to be uniform across the surface of the device.

5. The method of claim 1, wherein the first optical signature corresponds to a wavelength of a first plurality of photons emitted by a first plasma of the first sense material and the second optical signature corresponds to a wavelength of a second plurality of photons emitted by a second plasma of the second sense material.

6. The method of claim 1, wherein the first sense material and the second sense material comprise at least one of a silicon-based material, a copper-based material, or a tungsten-based material, and wherein the first sense material is comprised of a distinct material from the second sense material.

7. The method of claim 1, wherein the device further comprises a mask positioned on the second layer, wherein the mask defines one or more features to be etched onto the surface of the device.

8. A method comprising:
  causing a device to be placed in a processing chamber of an electronics processing system, wherein the device comprises a first layer deposited on a surface of the device and a second layer deposited on the first layer, wherein the first layer comprises a first sense material deposited on a first portion of the surface and a second sense material deposited on a second portion of the surface, and wherein the second layer comprises a first etch material deposited on the first sense material and a second etch material deposited on the second sense material, and wherein the first sense material and the second sense material comprise at least one of a silicon-based material, a copper-based material, or a tungsten-based material, and wherein the first sense material is comprised of a distinct material from the second sense material;
  measuring, during an etch process performed for the device at the processing chamber, a first amount of time from an initiation of the etch process to a detection of a first indication of completion of etching of the first etch material, and a second amount of time from the initiation of the etch process to a detection of a second indication of completion of etching of the second etch material, wherein the etch process etches the second layer of the device based on an initial set of etch parameter settings;
  determining a first etch rate of the processing chamber, based on the first amount of time and a thickness of the second layer of the etched device, and a second etch rate of the processing chamber, based on the second amount of time and the thickness of the second layer of the etched device;
  determining, based on the first etch rate and the second etch rate, a selectivity of the etch process performed at the processing chamber; and
  determining, based on the selectivity of the etch process, an optimized set of etch parameter settings to be applied at the processing chamber during subsequent etch processes.

9. The method of claim 8, wherein the first indication of completion of etching the first etch material comprises a first optical signature associated with the first sense material and the second indication of completion of etching the second etch material comprises a second optical signature associated with the second sense material, and wherein the first optical signature and the second optical signature can be detected by an optical detection component of the processing chamber.

10. The method of claim 9, wherein the first layer further comprises a third sense material deposited at a third portion of the surface, wherein the third sense material is associated with a third optical signature that is detected by the optical detection component during the etch process.

11. The method of claim 10, further comprising:
- measuring, during the etch process, a third amount of time from the initiation of the etch process to a detection of a third indication of completion of etching of the first etch material at the third portion of the surface of the device;
- determining, based on the measured third completion time and the thickness of the second layer, a third etch rate of the processing chamber; and
- determining, based on a difference between the first etch rate and the third etch rate, that an overall etch rate associated with the first etch material is not uniform across the surface of the device, wherein the optimized set of etch parameter settings is determined to cause the overall etch rate of the processing chamber to be uniform across the surface of the device.

12. The method of claim 9, wherein the first optical signature corresponds to a wavelength of a first plurality of photons emitted by a first plasma of the first sense material and the second optical signature corresponds to a wavelength of a second plurality of photons emitted by a second plasma of the second sense material.

13. The method of claim 8, wherein the device further comprises a mask positioned on the second layer, wherein the mask defines one or more features to be etched onto the surface of the device.

\* \* \* \* \*